(12) United States Patent
Shen

(10) Patent No.: US 8,553,443 B2
(45) Date of Patent: *Oct. 8, 2013

(54) MEMORY DEVICE AND MEMORY ACCESS METHOD

(76) Inventor: Biao Shen, Chiba (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/357,712

(22) Filed: Jan. 25, 2012

(65) Prior Publication Data

US 2012/0163062 A1 Jun. 28, 2012

Related U.S. Application Data

(63) Continuation of application No. 12/687,630, filed on Jan. 14, 2010, now Pat. No. 8,335,098.

(30) Foreign Application Priority Data

Jan. 15, 2009 (JP) ................. 2009-006703

(51) Int. Cl.
*G11C 17/00* (2006.01)
(52) U.S. Cl.
USPC .......................... 365/94; 365/104
(58) Field of Classification Search
USPC ............................................ 365/94
See application file for complete search history.

(56) References Cited

U.S. PATENT DOCUMENTS

| 6,728,137 | B1 | 4/2004 | Lin | |
|---|---|---|---|---|
| 6,772,314 | B2* | 8/2004 | Kashine | 711/202 |
| 7,003,619 | B1* | 2/2006 | Moore et al. | 711/102 |
| 7,436,691 | B2 | 10/2008 | Yamada et al. | |
| 8,335,098 | B2* | 12/2012 | Shen | 365/94 |
| 2007/0025151 | A1* | 2/2007 | Lee | 365/185.11 |
| 2009/0172321 | A1* | 7/2009 | Scheuerlein et al. | 711/161 |

FOREIGN PATENT DOCUMENTS

JP 2006-323981 A 11/2006

OTHER PUBLICATIONS

U.S. Appl. No. 12/687,630.*

* cited by examiner

*Primary Examiner* — Kretelia Graham
(74) *Attorney, Agent, or Firm* — Brinks Hofer Gilson & Lione

(57) ABSTRACT

Provided is a memory device in which the circuit structure is simplified while the functions of a memory including an OTP memory and a memory including a pseudo-MTP memory are maintained. A memory device includes a plurality of memory sets each including a mark bit storage area for storing a mark bit, which indicates that an object is deleted data, and a data bit storage area for storing data, the memory device being built from an OTP memory including an OTP memory block and a pseudo-MTP memory block, the OTP memory block containing a given number of memory sets to operate as an OTP memory, the pseudo-MTP memory block containing the rest of the memory sets operates as a pseudo-MTP memory. The mark bit is written in advance in the mark bit storage area of the OTP memory block.

3 Claims, 6 Drawing Sheets

FIG. 5

| ADDRESS | DATA | MARK BIT |
|---|---|---|
| 0 | | 0 |
| 1 | | 0 |
| ⋮ | | ⋮ |
| ⋮ | | ⋮ |
| 8 | | 0 |
| 9 | | 1 |
| ⋮ | | ⋮ |
| ⋮ | | ⋮ |
| 15 | | 1 |

SEARCH ↓

→ ADDRESS TO BE FOUND IN SEARCH "9"

FIG. 6

| ADDRESS | DATA | MARK BIT |
|---|---|---|
| 0 | | 0 |
| 1 | | 0 |
| ⋮ | | ⋮ |
| ⋮ | | ⋮ |
| 8 | | 0 |
| 9 | | 1 |
| ⋮ | | ⋮ |
| ⋮ | | ⋮ |
| 15 | | 1 |

ADDRESS SEARCHED FOR BY SEARCH UNIT 5 →

→ DATA TO BE READ

FIG. 7

| ADDRESS | DATA | MARK BIT |
|---|---|---|
| 0 | | 0 |
| 1 | | 0 |
| ⋮ | | ⋮ |
| ⋮ | | ⋮ |
| 8 | | 0 |
| 9 | | 1→0 |
| 10 | | 1 |
| ⋮ | | ⋮ |
| ⋮ | | ⋮ |
| 15 | | 1 |

SPECIFIED ADDRESS → 9

CHANGE MARK BIT FROM "1" TO "0"
WRITE DATA

MEMORY DEVICE AND MEMORY ACCESS METHOD

RELATED APPLICATIONS

This application is a continuation of U.S. patent application Ser. No. 12/687,630, filed Jan. 14, 2010 now U.S. Pat. No. 8,225,098, which claims priority under 35 U.S.C. §119 to Japanese Patent Application No. 2009-006703 filed on Jan. 15, 2009, the entire contents of which are hereby incorporated by reference.

BACKGROUND OF THE INVENTION

1. Field of the Invention

The present invention relates to a memory device and a memory access method which use a one time programmable (OTP) memory as a multi time programmable (MTP) memory spuriously.

2. Description of the Related Art

Memory devices that include, among other components, a frequency control OTP memory, a pseudo-MTP memory where a luminance control OTP memory is used spuriously as an MTP memory, and control circuits for controlling the frequency control and luminance control memories separately have been utilized as a memory device that stores information for controlling a display. Many integrated circuits that need a non-volatile memory employ an OTP memory in place of an erasable programmable ROM (EEPROM) to cut the process cost. OTP memories allow write operation only once. Pseudo-MTP memories are structured to increase the seeming number of times of rewrite by using a plurality of OTP memories. The use of these memories is popular. OTP memories and pseudo-MTP memories are known technologies and described in, for example, JP 2006-323981 A and U.S. Pat. No. 6,728,137.

In conventional memory devices that are provided in an integrated circuit for controlling a display device, the frequency control memory including an OTP memory and the luminance control memory including a pseudo-MTP memory are indispensable as well as the control circuits for controlling the frequency control and luminance control memories separately. The conventional memory devices therefore consume much power (current), take up a large area on the integrated circuit board, and are large in number of signal lines connected to peripheral circuits of the memory device, thus raising the cost of the integrated circuit. Another problem is that the frequency control OTP memory and the pseudo-MTP memory for adjusting the luminance differ from each other in operation and control method, which makes it difficult to give a memory device a single-memory structure. The pseudo-MTP memory which allows rewrite a plurality of times operates to read/write all memories sequentially, unlike the OTP memory where data is written only once and cannot be rewritten. The pseudo-MTP memory thus completely differs from the OTP memory in function, operation, and control method, and integrating the two different memories into one is difficult.

In integrated circuits that require a non-volatile memory, an OTP memory and a pseudo-MTP memory are originally used for different purposes and controlled by different control methods. However, most of peripheral circuits of the OTP memory and the pseudo-MTP memory are the same circuits. Nevertheless, making one of the OTP memory and the pseudo-MTP memory also serve as the other has not been practiced. Providing separate OTP memory and pseudo-MTP memory in the integrated circuit also means that the OTP memory and the pseudo-MTP memory have to be controlled individually, which takes up a large circuit area and makes the downsizing of the integrated circuit difficult.

SUMMARY OF THE INVENTION

The present invention has been made in view of these circumstances, and an object of the present invention is therefore to provide a memory device and a memory access method in which the circuit structure is simplified while the functions of a memory including an OTP memory and a memory including a pseudo-MTP memory are maintained.

A memory device according to the present invention includes a plurality of memory sets each including a mark bit storage area for storing a mark bit, which indicates that an object is deleted data, and a data bit storage area for storing data to be stored. The mark bit is a logical bit and not limited to 1 bit. The mark bit storage area is an area for recording that data is deleted logically. The data bit storage area is an area for recording data logically. The memory device is built from a one time programmable (OTP) memory that includes an OTP memory block and a pseudo-MTP memory block. The OTP memory block contains a given number of memory sets selected out of the plurality of memory sets to operate as an OTP memory. The rest of the plurality of memory sets which remains after the memory sets of the OTP memory block are excluded operates as a pseudo-MTP memory in the pseudo-MTP memory block. The memory device includes: address search means which refers to the mark bit to obtain an address of one of the plurality of memory sets where data is to be read and written; reading means which, upon input of a block selection signal for selecting one of the OTP memory block and the pseudo-MTP memory block, accesses the memory block that is selected based on the block selection signal to read stored data out of the data bit storage area of the memory set that is indicated by the address obtained by the address search means; writing means which uses the address obtained by the address search means to identify a memory set in the pseudo-MTP memory block where data is to be newly written, and writes data to be written in the data bit storage area of the identified memory set; and mark bit writing means which writes the mark bit in the mark bit storage area of the memory set that is indicated by the address obtained by the address search means. The memory device is characterized in that the mark bit is written in advance in the mark bit storage area of the OTP memory block.

According to the memory device of the present invention, the plurality of memory sets are structured to allow reading and writing of a plurality of systems of data, and the address search means takes into account to which system of data to be read and written belongs in obtaining the address of the memory set where the data is to be read and written.

According to the memory device of the present invention, the reading means and the writing means are structured to read and write data in the data bit storage areas of a given number of memory sets, and the mark bit writing means writes the mark bit in the mark bit storage areas of the given number of memory sets, with the address obtained by the address search means as a starting point.

A memory access method according to the present invention is for a memory device that includes a plurality of memory sets each including a mark bit storage area for storing a mark bit, which indicates that an object is deleted data, and a data bit storage area for storing data to be stored, the memory device being built from a one time programmable (OTP) memory that includes an OTP memory block, which contains a given number of memory sets selected out of the plurality of memory sets to operate as an OTP memory, and a pseudo-MTP memory block, which contains the rest of the plurality of memory sets remaining after the memory sets of the OTP block are excluded and operating as a pseudo-MTP memory, the memory device writing the mark bit in advance in the mark bit storage area of the OTP memory block. The memory access method includes: searching for an address by referring to the mark bit to obtain the address of one of the plurality of memory sets where data is to be read and written; reading stored data by, upon input of a block selection signal for selecting one of the OTP memory block and the pseudo-MTP memory block, accessing the memory block that is selected based on the block selection signal to read the stored data out of the data bit storage area of the memory set that is indicated by the address obtained in the searching for the address; writing data by using the address obtained in the searching for the address to identify a memory set in the pseudo-MTP memory block where data is to be newly written, and writing the data to be written in the data bit storage area of the identified memory set; and writing the mark bit in the mark bit storage area of the memory set that is indicated by the address obtained in the searching for the address.

According to the memory access method of the present invention, the plurality of memory sets are structured to allow reading and writing of a plurality of systems of data, and the searching for the address takes into account to which system of data to be read and written belongs in obtaining the address of the memory set where the data is to be read and written.

According to the memory access method of the present invention, the reading and the writing are performed so as to read and write data in the data bit storage areas of a given number of memory sets, and the writing the mark bit writes the mark bit in the mark bit storage areas of the given number of memory sets, with the address obtained in the searching for the address as a starting point.

According to the present invention, a memory device conventionally built from a memory that includes an OTP memory, a memory that includes a pseudo-MTP memory, and control circuits for controlling the former and latter memories separately is built from one memory block and circuits that read and write data in the memory block. The present invention thus simplifies the circuit structure while maintaining the functions of the memory that includes an OTP memory and the memory that includes a pseudo-MTP memory. The memory device consequently takes up a smaller area on the integrated circuit board, consumes less power and current, and is reduced in number of memory and circuit parts. The present invention therefore provides an effect that the cost is lowered.

BRIEF DESCRIPTION OF THE DRAWINGS

In the accompanying drawings:

FIG. 5 is an explanatory diagram illustrating a mark bit search operation;

FIG. 6 is an explanatory diagram illustrating a data reading operation; and

FIG. 7 is an explanatory diagram illustrating a data writing operation.

DETAILED DESCRIPTION OF THE PREFERRED EMBODIMENTS

First Embodiment

Figure 1:
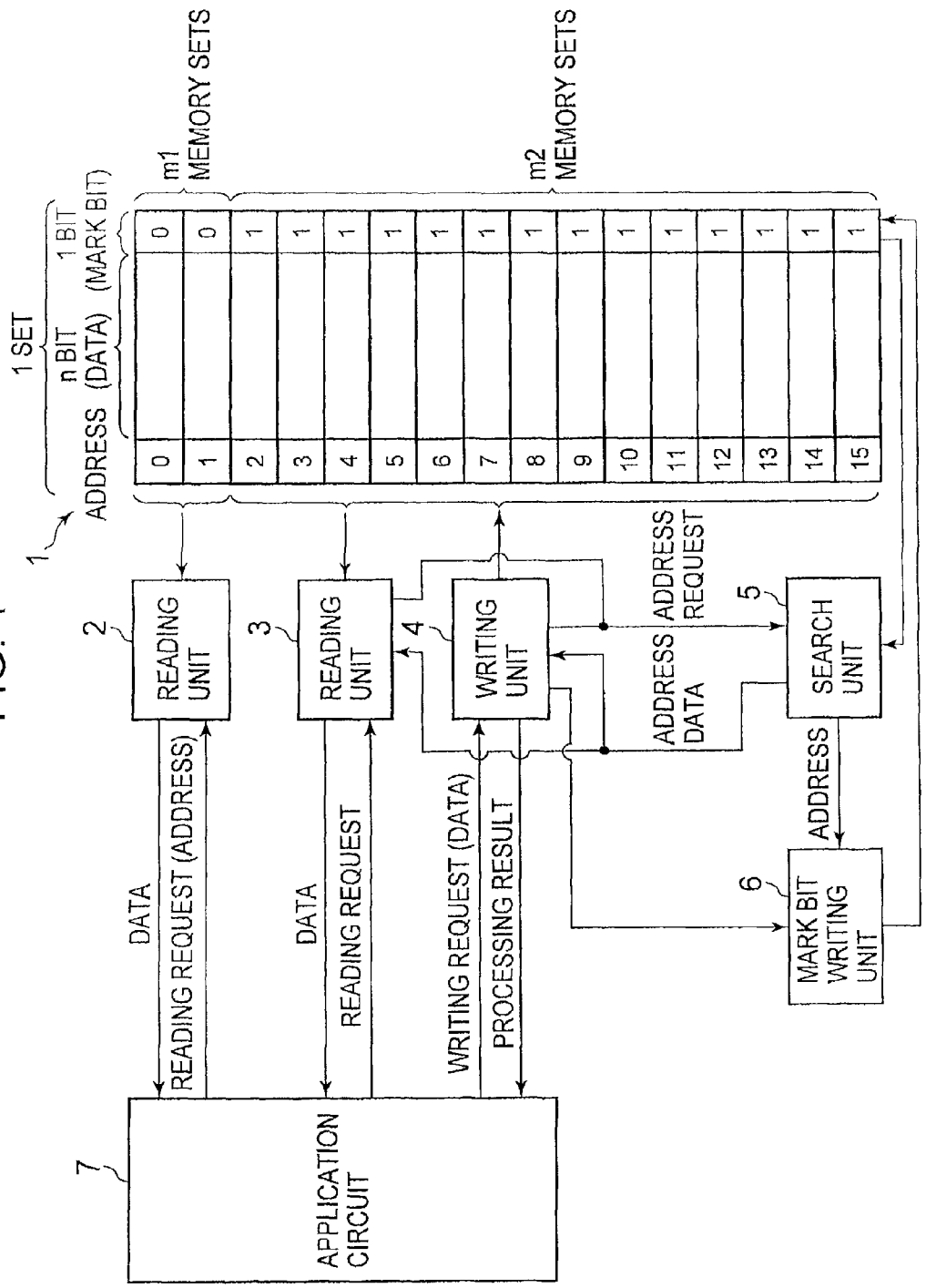
FIG. 1 is a block diagram illustrating a structure of a first embodiment of the present invention.

Hereinafter, a memory device according to a first embodiment of the present invention is described next with reference to the drawings. FIG. 1 is a block diagram illustrating the structure of the first embodiment. In FIG. 1, denoted by Reference Symbol 1 is a memory block built from a one time programmable (OTP) memory. The memory block 1 in the example of FIG. 1 is made up of sixteen memory sets. Each of the memory sets includes n (n is a natural number) bits (eight bits, for example) of data bit and one bit of mark bit. Each memory set is assigned an address and can be identified uniquely by specifying an address. The memory block 1 includes an OTP memory block, which includes m1 (m1 is a natural number) memory sets selected out of the sixteen memory sets and operates as an OTP memory, and a pseudo-MTP memory block, which includes m2 (m2 is a natural number expressed as m2=16−m1) memory sets and operates as a pseudo-MTP memory. The natural numbers m1 and m2 in the description given here are 2 and 14 (=16−2), respectively.

In an initial state, given data is set in advance to data bits of the OTP memory block and "0" is set to all mark bits of the OTP memory block. Further, in the initial state, "1" is set to all n-bit data bits of the memory sets in the pseudo-MTP memory block in which data has not been written and "1" is set to all mark bits of the memory sets in the pseudo-MTP memory block in which data has not been written. The initial state here means a state immediately after the memory device is manufactured a state where the memory device has never been put into use.

Denoted by Reference Symbol 2 is a reading unit that reads a data bit out of the OTP memory block of the memory block 1 and outputs the read data in response to a reading request. Denoted by Reference Symbol 3 is a reading unit that reads a data bit of the latest data out of the pseudo-MTP memory block of the memory block 1 and outputs the read data in response to a reading request. Denoted by Reference Symbol 4 is a writing unit which writes the latest data in the pseudo-MTP memory block of the memory block 1 in response to a writing request. Denoted by Reference Symbol 5 is a search unit which refers to mark bits in the memory block 1 to search for a memory set in the pseudo-MTP memory block where the latest data has been written, and returns the address of the found memory set in response to an address request from the reading unit 3 or the writing unit 4. Denoted by Reference Symbol 6 is a mark bit writing unit which uses an address output from the search unit 5 to write a mark bit in a deleted memory set so that already written data is treated as deleted data. Denoted by Reference Symbol 7 is an application circuit which uses the memory device of FIG. 1 to read stored data out of the OTP memory block and to read/write desired data in the pseudo-MTP memory block.

Next, the operation of the search unit 5 of FIG. 1 is described with reference to FIG. 5. FIG. 5 is a diagram illustrating how the search unit 5 of FIG. 1 refers to mark bits in the memory block 1 to search for a memory set in the pseudo-MTP memory block where the latest data has been written and returns the address of the found memory set in response to an address request from the reading unit 3 or the writing unit 4. The search unit 5 sequentially refers to mark bits of the memory sets in a direction from the smallest address value ("0" in this example) toward the largest address value ("15" in this example) to search for a memory set whose mark bit is "1" and, when the objective memory set is found, returns the address value of this memory set. In the example of FIG. 5 where mark bits of memory sets whose address values are "0" to "8" are "0" and a mark bit of a memory set that has an address value "9" is "1", the search unit 5 outputs an address value "9". A memory set in which the latest data has been written can be searched for through this operation.

Next, the operation of the reading unit 3 of FIG. 1 is described with reference to FIG. 6. FIG. 6 is a diagram illustrating how the reading unit 3 reads a data bit of the latest data out of the pseudo-MTP memory block of the memory block 1 and outputs the read data in response to a reading request. The reading unit 3 outputs an address request to the search unit 5, reads a data bit of a memory set that is indicated by an address value returned in response to the address request, and outputs the data bit. In the example of FIG. 6, when the returned address value is "9", data of a memory set that has an address value "9" is read and output. The latest data can be read through this operation.

Next, the operation of the writing unit 4 of FIG. 1 is described with reference to FIG. 7. FIG. 7 is a diagram illustrating how the writing unit 4 writes the latest data in the pseudo-MTP memory block of the memory block 1 in response to a writing request. The writing unit 4 outputs an address request to the search unit 5, increments an address value returned in response to the address request by 1 (+1), and writes a data bit to be written in a memory set that is indicated by the incremented address value. Meanwhile, the mark bit writing unit 6 changes a mark bit of the memory set that is indicated by the address value output from the search unit 5 from "1" to "0". In the example of FIG. 7, when the returned address value is "9", "1" is added to "9" and a data bit to be written is written in a memory set that is indicated by an address value "10" while a mark bit of a memory set that is indicated by an address value "9" is changed from "1" to "0". Through this operation, data is deleted from a memory set where the latest data has been stored up to that point, and hence data that is now the latest data can be written in the memory set.

Next, an operation of reading/writing data upon instruction from an application circuit 7 is described with reference to FIG. 1. First, in order to read data that is written in the OTP memory block in advance, i.e., at the time the memory device is manufactured, the application circuit 7 outputs a reading request signal to the reading unit 2. The reading request signal contains an address value specifying which data is to be read. When the address value is contained, the reading unit 2 reads data that has the specified address value. In the case where the contained address value is "0", for example, data at an address "0" is read. When the reading request signal contains no address value, the reading unit 2 reads every piece of data stored in the OTP memory block. The reading unit 2 outputs the read data to the application circuit 7. Data written in the OTP memory block in advance, i.e., at the time the memory device is manufactured, can be read through this operation.

Next, in order to read data stored in the pseudo-MTP memory block, the application circuit 7 outputs a reading request signal to the reading unit 3. Receiving the reading request signal, the reading unit 3 outputs an address request signal to the search unit 5. Upon reception of the address request signal, the search unit 5 searches for a memory set in which the latest data has been written, and outputs the address value of this memory set as address data to the reading unit 3. The reading unit 3 reads data out of the memory set that is indicated by the address value output from the search unit 5, and outputs the read data to the application circuit 7. The latest data stored in the pseudo-MTP memory block can be read through this operation.

Next, in order to update data stored in the pseudo-MTP memory block (in order to newly write data), the application circuit 7 outputs a writing request signal to the writing unit 4. The writing request signal contains data to be written. The writing unit 4 outputs an address request signal to the search unit 5. Upon reception of the address request signal, the search unit 5 searches for a memory set in which the latest data has been written, and outputs the address value of the memory set as address data to the writing unit 4. The writing unit 4 increments the address value output from the search unit 5 by 1 (+1), writes the data to be written in the memory set that is indicated by the incremented address value, and outputs a processing result signal to the application circuit 7. In parallel to this operation, the mark bit writing unit 6 changes a mark bit of the memory set that is indicated by the address value output from the search unit 5 to "0". Through the operation described above, the latest data stored in the pseudo-MTP memory block can be updated.

Second Embodiment

Figure 2:
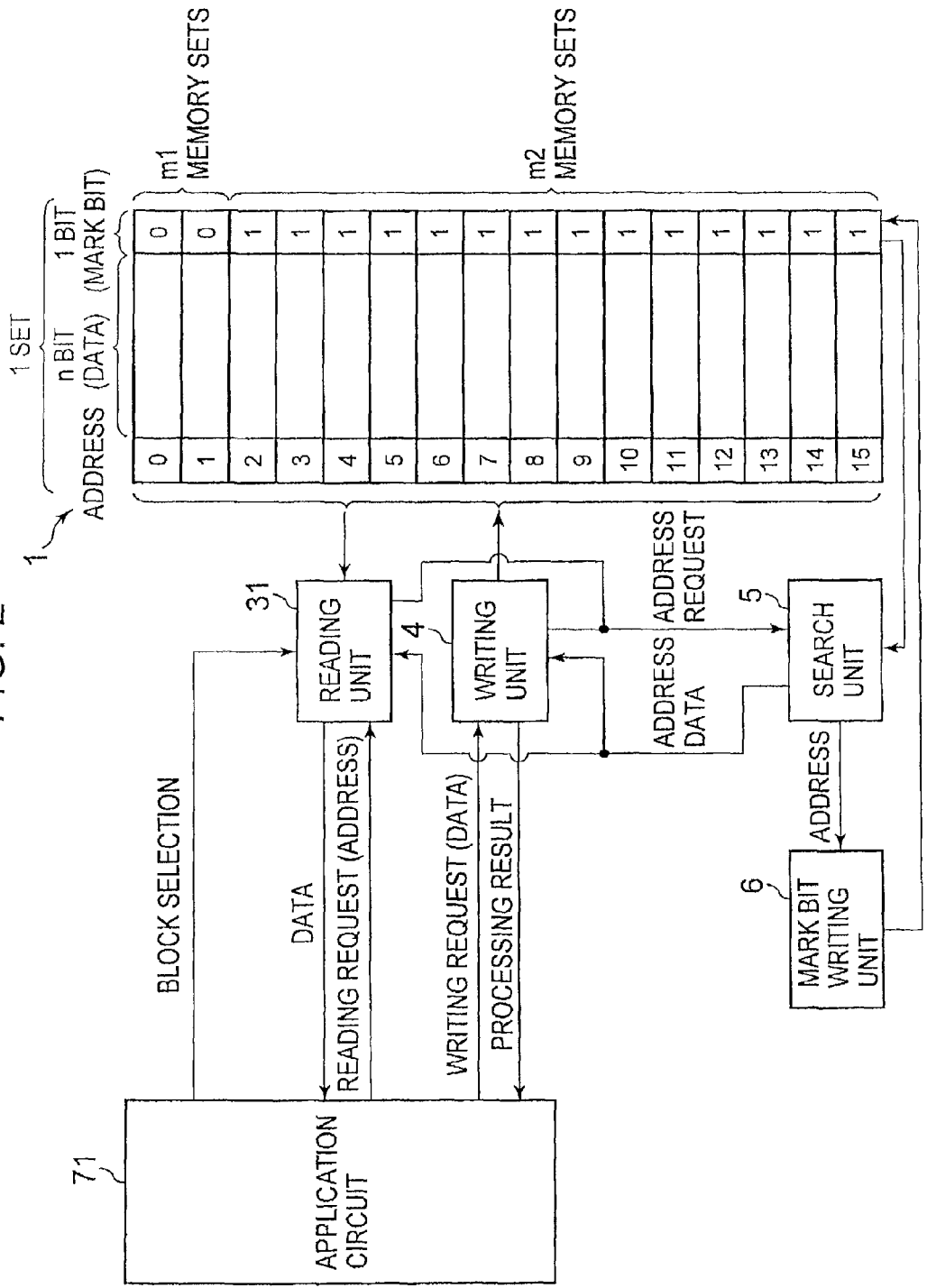
FIG. 2 is a block diagram illustrating a structure of a second embodiment of the present invention.

Next, a memory device according to a second embodiment of the present invention is described with reference to the drawings. FIG. 2 is a block diagram illustrating the structure of the second embodiment. In FIG. 2, denoted by Reference Symbol 1 is a memory block built from a one time programmable (OTP) memory and has a structure similar to that of the memory block 1 described in the first embodiment. Denoted by Reference Symbol 31 is a reading unit that receives an input of a block selection signal, chooses one of the OTP memory block and the pseudo-MTP memory block that contains data to be read based on the block selection signal, reads the data bit out of the chosen memory block, and outputs the read data.

A writing unit 4, a search unit 5, and a mark bit wiring unit 6 that are illustrated in FIG. 2 are structured the same way as the writing unit 4, the search unit 5, and the mark bit writing unit 6 of the first embodiment illustrated in FIG. 1, and their detailed descriptions are therefore omitted here.

Next, an operation of reading/writing data upon instruction from an application circuit 71 is described with reference to FIG. 2. First, in order to read data that is written in the OTP memory block in advance, i.e., at the time the memory device is manufactured, the application circuit 71 outputs a block selection signal that indicates that the OTP memory block is to be chosen to the reading unit 31. The application circuit 71 then outputs a reading request signal to the reading unit 31. The reading request signal contains an address value specifying which data is to be read. When the address value is contained, the reading unit 31 reads data that has the specified address value. In the case where the contained address value is "0", for example, data at an address "0" is read. When the reading request signal contains no address value, the reading unit 31 reads every piece of data stored in the OTP memory block. The reading unit 31 outputs the read data to the application circuit 71. Data written in the OTP memory block in advance, i.e., at the time the memory device is manufactured, can be read through this operation.

In order to read data stored in the pseudo-MTP memory block, the application circuit 71 outputs a block selection signal that indicates that the pseudo-MTP memory block is to be chosen to the reading unit 31. The application circuit 71 then outputs a reading request signal to the reading unit 31. Receiving the reading request signal, the reading unit 31 outputs an address request signal to the search unit 5. Upon reception of the address request signal, the search unit 5 searches for a memory set in which the latest data has been written, and outputs the address value of this memory set as address data to the reading unit 31. The reading unit 31 reads data out of the memory set that is indicated by the address value output from the search unit 5, and outputs the read data to the application circuit 71. The latest data stored in the pseudo-MTP memory block can be read through this operation.

Next, in order to update data stored in the pseudo-MTP memory block (in order to newly write data), the application circuit 71 outputs a writing request signal to the writing unit 4. The writing request signal contains data to be written. The writing unit 4 outputs an address request signal to the search unit 5. Upon reception of the address request signal, the search unit 5 searches for a memory set in which the latest data has been written, and outputs the address value of the memory set as address data to the writing unit 4. The writing unit 4 increments the address value output from the search unit 5 by 1 (+1), writes the data to be written in the memory set that is indicated by the incremented address value, and outputs a processing result signal to the application circuit 71. In parallel to this operation, the mark bit writing unit 6 changes a mark bit of the memory set that is indicated by the address value output from the search unit 5 to "0". Through the operation described above, the latest data stored in the pseudo-MTP memory block can be updated.

Third Embodiment

Figure 3:
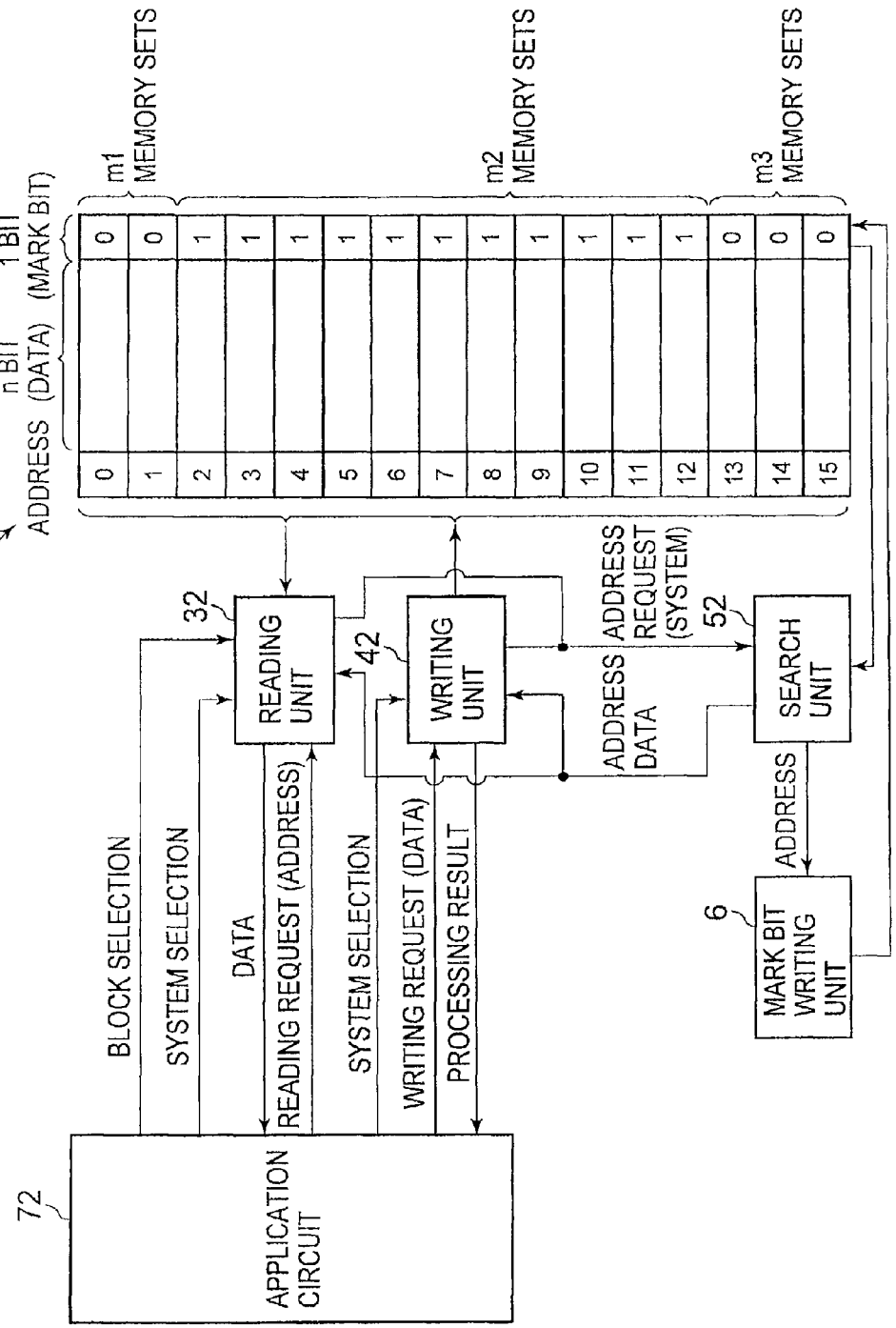
FIG. 3 is a block diagram illustrating a structure of a third embodiment of the present invention.

Next, a memory device according to a third embodiment of the present invention is described with reference to the drawings. FIG. 3 is a block diagram illustrating the structure of the third embodiment. In FIG. 3, denoted by Reference Symbol 1 is a memory block built from a one time programmable (OTP) memory. The memory block 1 in the example of FIG. 3 is made up of sixteen memory sets each of which includes n (n is a natural number) bits (eight bits, for example) of data bit and one bit of mark bit. Each memory set is assigned an address and can be identified uniquely by specifying an address. The memory block 1 includes a first OTP memory block, which includes m1 (m1 is a natural number) memory sets selected out of the sixteen memory sets and operates as an OTP memory, a second OTP memory block, which includes m3 (m3 is a natural number) memory sets and operates as an OTP memory, and a pseudo-MTP memory block, which includes m2 (m2 is a natural number expressed as m2=16−m1−m3) memory sets and operates as a pseudo-MTP memory. The memory block structure illustrated in FIG. 3 makes it possible to read and write two systems of data with a single memory block 1. The natural numbers m1, m3, and m2 in the description given here are 2, 3, and 11 (=16−2−3), respectively.

In the initial state, given data is set in advance to data bits of the first and second OTP memory blocks and "0" is set to all mark bits of the first and second OTP memory blocks. In the initial state, "1" is set to all n-bit data bits of the pseudo-MTP memory block and "1" is set to all mark bits of the pseudo-MTP memory block.

Denoted by Reference Symbol 32 is a reading unit that receives an input of a block selection signal and a system selection signal, chooses a memory block that contains data to be read from among the OTP memory blocks and the pseudo-MTP memory block based on the block selection signal, chooses one of two systems based on the system selection signal, reads a data bit out of the chosen memory block, and outputs the read data. Denoted by Reference Symbol 42 is a writing unit that chooses one of two systems based on the system selection signal and responds to a writing request by writing the latest data in a memory set in the pseudo-MTP memory block of the memory block 1 that belongs to the chosen system.

Denoted by Reference Symbol 52 is a search unit that refers to mark bits in the memory block 1 to search for a memory set in the pseudo-MTP memory block where the latest data has been written and returns the address of the found memory set in response to an address request from the reading unit 32 or the writing unit 42. An address request input to the search unit 52 contains information for identifying which of two systems is chosen. The search unit 52 chooses a system based on the system identification information and returns the address value of a memory set in which the latest data has been written.

A mark bit writing unit 6 that are illustrated in FIG. 3 are structured the same way as the writing unit 6 of the first embodiment illustrated in FIG. 1, and their detailed descriptions are therefore omitted here.

Next, an operation of reading/writing data upon instruction from an application circuit 72 is described with reference to FIG. 3. First, in order to read data written in the OTP memory blocks in advance, i.e., at the time the memory device is manufactured, the application circuit 72 outputs a block selection signal that indicates that the OTP memory blocks are to be chosen to the reading unit 32, and also outputs a system selection signal indicating which of two systems is to be chosen to the reading unit 32. The application circuit 72 then outputs a reading request signal to the reading unit 32. The reading request signal contains an address value specifying which data is to be read. When the address value is contained, the reading unit 32 reads data that has the specified address value.

In the case where the contained address value is "0", for example, data at an address "0" is read. When the reading request signal contains no address value, the reading unit 32 reads every piece of data stored in one of the OTP memory blocks that belongs to the system chosen by the system selection signal. For example, data at an address "0" and data at an address "1" are read when a first system is chosen whereas data at an address "13", data at an address "14", and data at an address "15" are read when a second system is chosen. The reading unit 32 outputs the read data to the application circuit 72. Of two systems of data written in the OTP memory blocks in advance, i.e., at the time the memory device is manufactured, data of a chosen system can be read through this operation.

Next, in order to read data stored in the pseudo-MTP memory block, the application circuit 72 outputs a block selection signal that indicates that the pseudo-MTP memory block is to be chosen to the reading unit 32 and also outputs a system selection signal indicating which of two systems is to be chosen to the reading unit 32. The application circuit 72 then outputs a reading request signal to the reading unit 32. Receiving the reading request signal, the reading unit 32 outputs an address request signal to the search unit 52. The address request signal contains information for identifying the chosen system.

Upon reception of the address request signal, the search unit 52 searches for a memory set in which the latest data has been written, and outputs the address value of the memory set as address data to the reading unit 32. At this time, the search unit 52 performs the search in ascending order of address value (in FIG. 3, from the top downward) when the first system is chosen, and in descending order of address value (in FIG. 3, from the bottom upward) when the second system is chosen, to thereby obtain the address value of a memory set in which the latest data of the chosen system has been stored.

The reading unit 32 reads data out of the memory set that is indicated by the address value output from the search unit 52, and outputs the read data to the application circuit 72. The latest data of chosen one of two systems can be read out of the pseudo-MTP memory block through this operation.

Next, in order to update data stored in the pseudo-MTP memory block (in order to newly write data), the application circuit 72 outputs a system selection signal to the writing unit 42. The application circuit 72 then outputs a writing request signal. The writing request signal contains data to be written. The writing unit 42 outputs an address request signal to the search unit 52. The address request signal contains information for identifying the chosen system. Upon reception of the address request signal, the search unit 52 searches for a memory set in which the latest data has been written, and outputs the address value of the memory set as address data to the writing unit 42. At this time, the search unit 52 performs the search in ascending order of address value when the first system is chosen, and in descending order of address value when the second system is chosen, to thereby obtain the address value of a memory set where the latest data of the chosen system has been stored.

When the first system is chosen, the writing unit 42 increments the address value output from the search unit 52 by 1 (+1), and writes the data to be written in a memory set that is indicated by the incremented address value. When the second system is chosen, on the other hand, the writing unit 42 decrements the address value output from the search unit 52 by 1 (−1), and writes the data to be written in a memory set that is indicated by the decremented address value. The writing unit 42 then outputs a processing result signal to the application circuit 72. In parallel to this operation, the mark bit writing unit 6 changes a mark bit of the memory set that is indicated by the address value output from the search unit 52 to "0". Through the operation described above, the latest data stored in the pseudo-MTP memory block can be updated.

Fourth Embodiment

Figure 4:
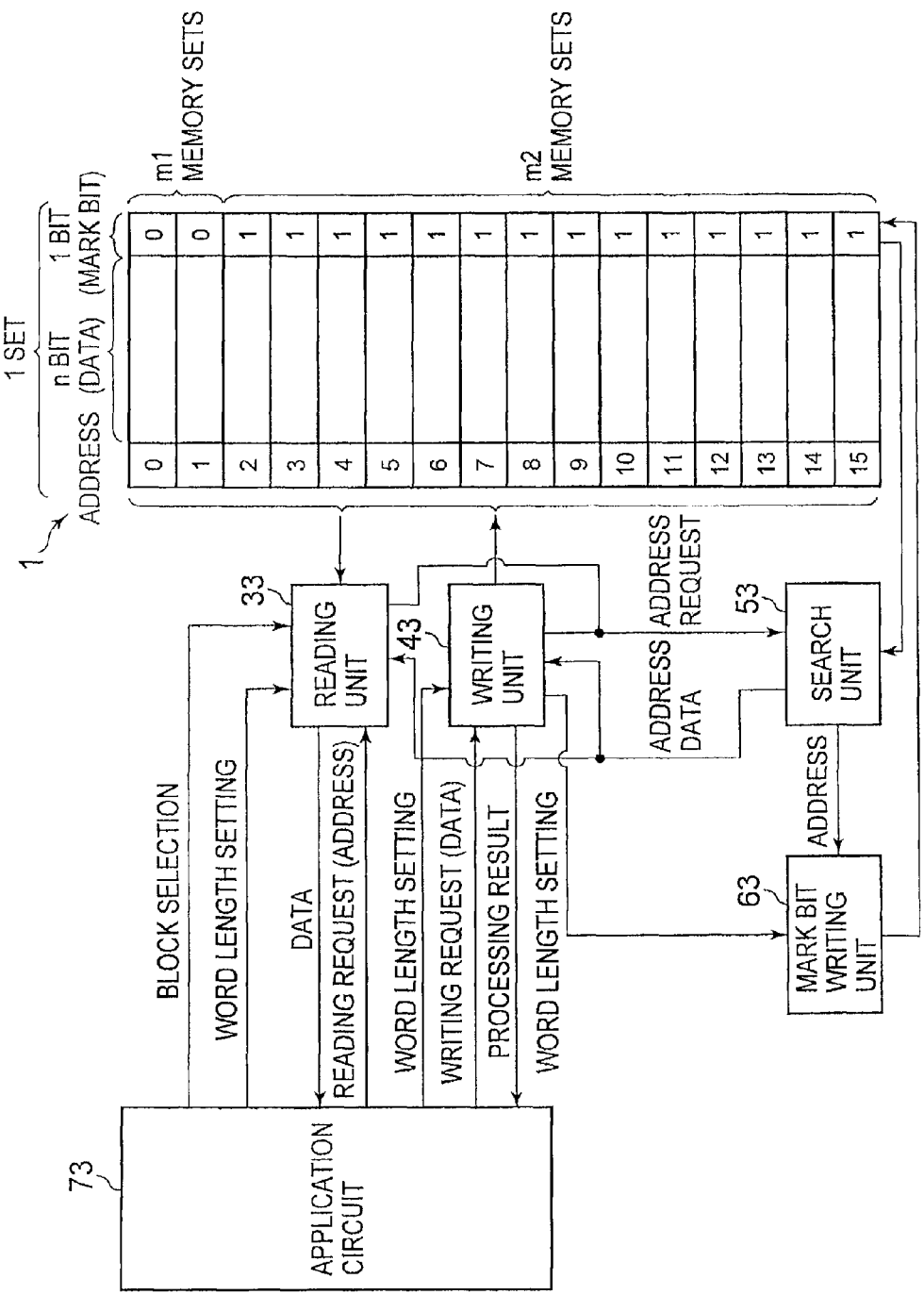
FIG. 4 is a block diagram illustrating a structure of a fourth embodiment of the present invention.

Next, a memory device according to a fourth embodiment of the present invention is described with reference to the drawings. FIG. 4 is a block diagram illustrating the structure of the fourth embodiment. In FIG. 4, denoted by Reference Symbol 1 is a memory block built from a one time programmable (OTP) memory. The memory block 1 in the example of FIG. 4 is made up of sixteen memory sets each of which includes n (n is a natural number) bits (eight bits, for example) of data bit and one bit of mark bit. Each memory set is assigned an address and can be identified uniquely by specifying an address. The memory block 1 includes an OTP memory block, which includes m1 (m1 is a natural number) memory sets selected out of the sixteen memory sets and operates as an OTP memory, and a pseudo-MTP memory block, which includes m2 (m2 is a natural number expressed as m2=16−m1) memory sets and operates as a pseudo-MTP memory. The natural numbers m1 and m2 in the description given here are 2 and 14 (=16−2), respectively.

In the initial state, given data is set in advance to data bits of the OTP memory block and "0" is set to all mark bits of the OTP memory block. In the initial state, "1" is set to all n-bit data bits of the pseudo-MTP memory block and "1" is set to all mark bits of the pseudo-MTP memory block.

Denoted by Reference Symbol 33 is a reading unit that receives an input of a block selection signal and a word length setting signal, chooses one of the OTP memory block and the pseudo-MTP memory block that contains data to be read based on the block selection signal, reads data bits to a word length that is set based on the word length setting signal, and outputs the read data. The word length is a value expressed as a bit number that is obtained by multiplying the bit number n of the data bits by an integer, or a value expressed as the number of memory sets required for the data bits including n bits. Denoted by Reference Symbol 43 is a writing unit that sets a word length based on the word length setting signal and responds to a writing request by writing the latest data in a number of memory sets in the pseudo-MTP memory block of the memory block 1 that corresponds to the set word length.

Denoted by Reference Symbol 53 is a search unit that refers to mark bits in the memory block 1 to search for a memory set in the pseudo-MTP memory block where the latest data has been written and returns the address of the found memory set in response to an address request from the reading unit 33 or the writing unit 43. Denoted by Reference Symbol 63 is a mark bit writing unit that receives an input of a word length setting signal and uses an address output from the search unit 53 so as to write mark bits in a number of memory sets that corresponds to the word length of data to be deleted so that already written data is treated as deleted data.

Next, an operation of reading/writing data upon instruction from an application circuit 73 is described with reference to FIG. 4. First, in order to read data written in the OTP memory block in advance, i.e., at the time the memory device is manufactured, the application circuit 73 outputs a block selection signal that indicates that the OTP memory block is to be chosen to the reading unit 33. The application circuit 73 then outputs a reading request signal to the reading unit 33. The reading request signal contains an address value specifying which data is to be read. When the address value is contained, the reading unit 33 reads data that has the specified address value.

In the case where the contained address value is "0", for example, data at an address "0" is read. When the reading request signal contains no address value, the reading unit 33 reads every piece of data stored in the OTP memory block. The reading unit 33 outputs the read data to the application circuit 73. Data written in the OTP memory block in advance, i.e., at the time the memory device is manufactured, can be read through this operation.

Next, in order to read data stored in the pseudo-MTP memory block, the application circuit 73 outputs a block selection signal that indicates that the pseudo-MTP memory block is to be chosen to the reading unit 33 and also outputs a word length setting signal. The application circuit 73 then outputs a reading request signal to the reading unit 33. Receiving the reading request signal, the reading unit 33 outputs an address request signal to the search unit 53. Upon reception of the address request signal, the search unit 53 searches for a memory set in which the latest data has been written, and outputs the address value of the memory set as address data to the reading unit 33.

The reading unit 33 reads a word length of data out of the memory set that is indicated by the address value output from the search unit 53, and outputs the read data to the application circuit 73. Through this operation, a set word length of the stored latest data can be read out of the pseudo-MTP memory block.

Next, in order to update data stored in the pseudo-MTP memory block (in order to newly write data), the application circuit 73 outputs a word length setting signal to the writing unit 43. The application circuit 73 then outputs a writing request signal. The writing request signal contains data to be written. The writing unit 43 outputs an address request signal to the search unit 53. Upon reception of the address request signal, the search unit 53 searches for a memory set in which the latest data has been written, and outputs the address value of the memory set as address data to the writing unit 43.

The writing unit 43 skips a number of memory sets that corresponds to a set word length with the address value output from the search unit 53 as a start point, and writes the set word length of data in a memory set. In parallel to this operation, the mark bit writing unit 63 receives an input of the word length setting signal and sets "0" to mark bits in a number of memory sets that corresponds to a set word length counted with the address value output from the search unit 53 as a start point. In the case where the word length corresponds to the length of two memory sets (n×2 bits), for example, "0" is set to mark bits of two memory sets. The latest data stored in the pseudo-MTP memory block can be updated through this operation.

The mark bit storage areas and data bit storage areas of the memory block are logical areas. Therefore, the present invention can be carried out when the memory block has other structures than those described in the first to fourth embodiments, including a structure disclosed in JP 2006-323981 A where a mark bit storage area and a data bit storage area are not separated clearly and a structure disclosed in U.S. Pat. No. 6,728,137 where a mark bit storage area and a data bit storage area are separated physically.

In the third embodiment, in order to write data, search positions of the OTP memory block and the pseudo-MTP memory block do not need to be searched in ascending or descending order of address value of the memory block. For instance, in FIG. 3, a memory set that has an address value "7" may be used as an OTP memory to write data after memory sets in the pseudo-MTP memory block that belong to the first system are searched in descending order of address value starting from a memory set that has an address value "6", or to write data after memory sets in the pseudo-MTP memory block that belong to the second system are searched in ascending order of address value starting from a memory set that has an address value "8".

As has been described, the present invention uses a single memory block 1 and circuits that read and write data in the memory block 1 to build a memory device, which is conventionally built from a frequency control memory including an OTP memory, a luminance control memory including a pseudo-MTP memory, and control circuits for controlling the former and latter memories separately. The present invention thus simplifies the circuit structure while maintaining the functions of the frequency control memory including an OTP memory and the luminance control memory including a pseudo-MTP memory. The memory device consequently takes up a smaller area on the integrated circuit board, consumes less power and current, and is reduced in number of memory and circuit parts. The cost is lowered as a result.

In FIGS. 2 to 4, the block selection signal output from the application circuit 71, 72, or 73 may be omitted. The application circuit 71, 72, or 73 in this case outputs a reading request (address) signal that contains information for choosing which block is to be read. Alternatively, the reading request (address) signal may contain address information of data to be read so that which block is to be read is chosen by directly specifying an address in the block to be read.

The search operation of the search units 5, 52, and 53 illustrated in FIGS. 1 to 4 may employ binary search in addition to sequential search. Binary search speeds up the search operation of the search units 5, 52, and 53.

What is claimed is:

1. A memory device comprising a plurality of memory sets each including a data bit storage area, the memory device comprising:
   a one time programmable (OTP) memory including at least one OTP memory block and at least one pseudo-multi time programmable (MTP) memory block, the at least one OTP memory block including a first number of memory sets of the plurality of memory sets that comprise an OTP memory, the at least one pseudo-MTP memory block including a second number of memory sets of the plurality of memory sets that comprise a pseudo-MTP memory,
   wherein each of the second number of memory sets comprises at least one mark bit, the mark bit indicating the presence or absence of data, the memory device further comprising:
      an address search unit that refers to the mark bits of the second number of memory sets to obtain an identified address of the second number of memory sets in which most recent data is written;
      a writing unit that writes the data bit storage area of one memory set of the second number of memory sets whose address is indicated by the identified address;
      a reading unit that accesses the data bit storage area of one memory set of the second number of memory sets whose address is indicated by the identified address; and
      a mark bit writing unit that writes the mark bit of one memory set of the second number of memory sets whose address is indicated by the identified address, wherein the mark bit writing unit changes the value of mark bit at the identified address.

2. The memory device according to claim 1, wherein the second number of memory sets are structured to allow reading and writing of a plurality of systems of data, and
   wherein, the address search unit obtains, based on a system selection signal, an identified address of the second number of memory sets.

3. The memory device according to claim 1, wherein the reading unit reads the OTP memory block, using an address contained in an instruction.

* * * * *